(12) United States Patent
Wiktorko

(10) Patent No.: US 10,598,297 B2
(45) Date of Patent: Mar. 24, 2020

(54) SERVOVALVE

(71) Applicant: Hamilton Sundstrand Corporation, Charlotte, NC (US)

(72) Inventor: Łukasz Wiktorko, Wroclaw (PL)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 134 days.

(21) Appl. No.: 15/698,705

(22) Filed: Sep. 8, 2017

(65) Prior Publication Data

US 2018/0128393 A1   May 10, 2018

(30) Foreign Application Priority Data

Nov. 9, 2016   (EP) .................................... 16461570

(51) Int. Cl.
*F16K 31/02* (2006.01)
*F15B 13/043* (2006.01)
(Continued)

(52) U.S. Cl.
CPC ............... *F16K 31/02* (2013.01); *F15B 9/07* (2013.01); *F15B 13/043* (2013.01); *F15B 13/0436* (2013.01); *F16K 11/07* (2013.01); *F16K 31/004* (2013.01); *F16K 31/04* (2013.01); *H01L 41/092* (2013.01); *H01L 41/0906* (2013.01); *H01L 41/0913* (2013.01); *Y10T 137/86614* (2015.04)

(58) Field of Classification Search
CPC .. F16K 31/02; F16K 31/04; F15B 9/07; F15B 13/043; F15B 13/0436; F15B 13/0438; Y10T 137/86614; H01L 41/0906; H01L 41/0913; H01L 41/092
See application file for complete search history.

(56) References Cited

U.S. PATENT DOCUMENTS 2,767,689 A * 10/1956 Moog, Jr. ............ F15B 13/0438
                                                                137/625.62
3,152,612 A * 10/1964 Avery .................... F16K 31/006
                                                                137/625.4
(Continued)

FOREIGN PATENT DOCUMENTS

DE         4311218 A1    12/1994
DE         4431600 A1    3/1996
(Continued)

OTHER PUBLICATIONS

Extended European Search Report for International Application No. 16461570.0 dated May 9, 2017, 7 pages.

*Primary Examiner* — Matthew W Jellett
(74) *Attorney, Agent, or Firm* — Cantor Colburn LLP

(57) ABSTRACT

A servovalve includes a fluid transfer valve assembly comprising a supply port and a control port, a moveable valve spool arranged to regulate flow of fluid from the supply port to the control port in response to a control signal, and a drive assembly configured to axially move the valve spool relative to the fluid transfer assembly in response to the control signal to regulate the fluid flow. The drive assembly includes a steerable member moveable by an amount determined by the control signal to cause corresponding movement of the valve spool. The drive assembly further includes piezoelectric actuator means configured to move said steerable member in response to the control signal.

7 Claims, 2 Drawing Sheets

(51) Int. Cl.
*F16K 31/00* (2006.01)
*F15B 9/07* (2006.01)
*H01L 41/09* (2006.01)
*F16K 31/04* (2006.01)
*F16K 11/07* (2006.01)

(56) References Cited

U.S. PATENT DOCUMENTS

| | | | | |
|---|---|---|---|---|
| 3,286,719 | A | * | 11/1966 | Myers ................. F15C 3/12 |
| | | | | 137/83 |
| 3,678,951 | A | * | 7/1972 | Coakley ............... F15C 3/12 |
| | | | | 137/14 |
| 4,046,061 | A | | 9/1977 | Stokes |
| 4,227,443 | A | * | 10/1980 | Toot ................ F15B 13/0436 |
| | | | | 137/625.61 |
| 6,202,670 | B1 | * | 3/2001 | O'Neill ............... F16K 31/007 |
| | | | | 137/625.5 |
| 6,786,238 | B2 | | 9/2004 | Frisch |
| 9,309,900 | B2 | | 4/2016 | Kopp |
| 2013/0087223 | A1 | * | 4/2013 | Ozzello ............ F15B 13/0436 |
| | | | | 137/551 |
| 2014/0042346 | A1 | | 2/2014 | Sangiah et al. |
| 2015/0047729 | A1 | | 2/2015 | Kopp et al. |
| 2018/0372128 | A1 | * | 12/2018 | Jaskiewicz ......... F15B 13/0402 |

FOREIGN PATENT DOCUMENTS

| | | | |
|---|---|---|---|
| EP | 0012743 | A1 | 6/1980 |
| GB | 2104249 | A | 3/1983 |
| JP | 62024004 | A * | 2/1987 |
| WO | 0159306 | A1 | 8/2001 |

* cited by examiner

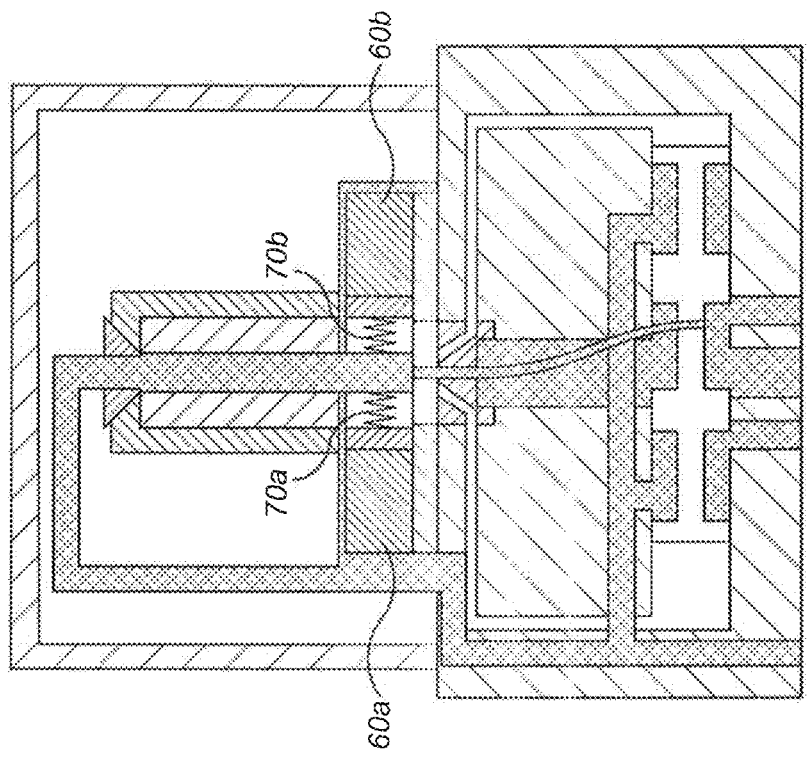
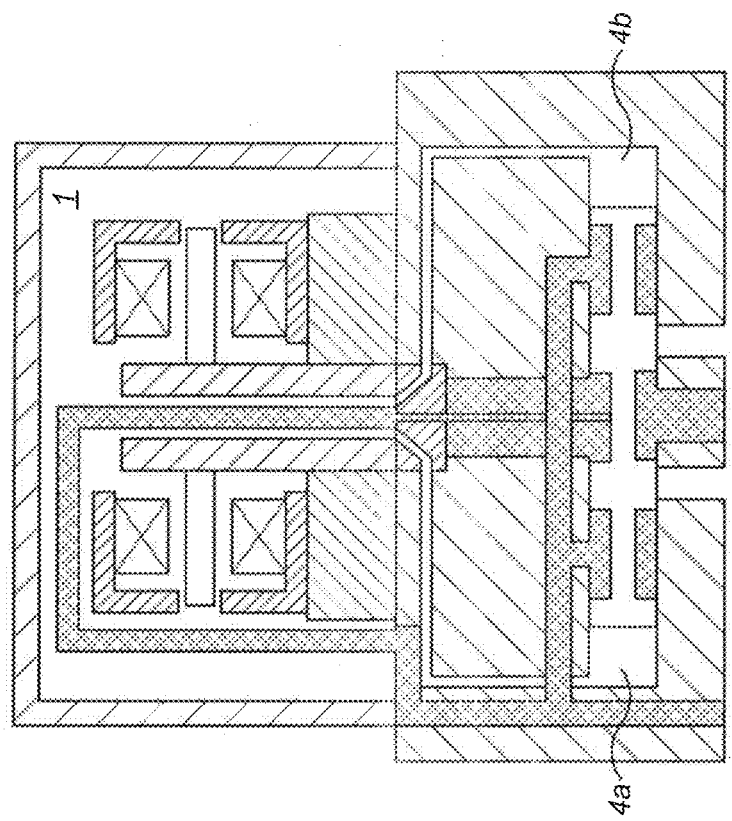
FIG. 2B
FIG. 2A
PRIOR ART

SERVOVALVE

FOREIGN PRIORITY

This application claims priority to European Patent Application No. 16461570.0 filed Nov. 9, 2016, the entire contents which is incorporated herein by reference.

TECHNICAL FIELD

The present disclosure relates to servovalves used to transfer quantities of, or manage the flow of fluid e.g. air.

BACKGROUND

Servovalves find a wide range of applications for controlling air or other fluid flow to effect driving or control of another part e.g. an actuator.

A servovalve assembly includes a motor controlled by a control current which controls flow to an air valve to control an actuator. Generally, a servovalve transforms an input control signal into movement of an actuator cylinder. The actuator controls e.g. an air valve. In other words, a servovalve acts as a controller, which commands the actuator, which changes the position of an air valve's (e.g. a so-called butterfly valve's) flow modulating feature.

Such mechanisms are used, for example, in various parts of aircraft where the management of air/fluid flow is required, such as in engine bleeding systems, anti-ice systems, air conditioning systems and cabin pressure systems. Servovalves are widely used to control the flow and pressure of pneumatic and hydraulic fluids to an actuator, and in applications where accurate position or flow rate control is required.

Conventionally, servovalve systems operate by obtaining pressurised fluid from a high pressure source which is transmitted through a load from which the fluid is output as a control fluid. Various types of servovalves are known—see e.g. GB 2104249, US 2015/0047729 and U.S. Pat. No. 9,309,900.

Electrohydraulic servovalves can have a first stage with a motor, e.g. an electrical or electromagnetic force motor or torque motor, controlling flow of a hydraulic fluid to drive a valve member e.g. a spool valve of a second stage, which, in turn, can control flow of hydraulic fluid to an actuator for driving a load. The motor can operate to position a moveable member, such as a flapper, in response to an input drive signal or control current, to drive the second stage valve member e.g. a spool valve.

Particularly in aircraft applications, but also in other applications, servovalves are often required to operate at various pressures and temperatures. For e.g. fast acting air valve actuators, relatively large flows are required depending on the size of the actuator and the valve slew rate. For such high flow rates, however, large valve orifice areas are required. For 'flapper' type servovalves, problems arise when dealing with large flows due to the fact that flow force acts in the direction of the flapper movement and the motor is forced to overcome the flow forces. For clevis-like metering valves such as described in U.S. Pat. Nos. 4,046,061 and 6,786,238, the flow forces, proportional to the flow, act simultaneously in opposite directions so that the clevis is balanced and centered. The clevis, however, needs to be big due to the requirement for bigger orifices to handle larger flows.

Jet pipe servovalves provide an alternative to 'flapper'—type servovalves. Jet pipe servovalves are usually larger than flapper type servovalves but are less sensitive to contamination. In jet pipe systems, fluid is provided via a jet pipe to a nozzle which directs a stream of fluid at a receiver. When the nozzle is centered—i.e. no current from the motor causes it to turn, the receiver is hit by the stream of fluid from the nozzle at the centre so that the fluid is directed to both ends of the spool equally. If the motor causes the nozzle to turn, the stream of fluid from the nozzle impinges more on one side of the receiver and thus on one side of the spool more than the other causing the spool to shift. The spool shifts until the spring force of a feedback spring produces a torque equal to the motor torque. At this point, the nozzle is centred again, pressure is equal on both sides of the receiver and the spool is held in the centered position. A change in motor current moves the spool to a new position corresponding to the applied current.

As mentioned above, jet pipe servovalves are advantageous in that they are less sensitive to contamination e.g. in the supply fluid or from the valve environment. These valves are, however, more complex and bulkier. The torque motor that comprises electromagnets to apply electromagnetic force to an armature to move the jet pipe is large and heavy, which adds to the size, weight and complexity of the overall system.

There is a need for a servovalve arrangement that can handle large fluid flows effectively, whilst retaining a light, simple and compact design.

The present disclosure provides a servovalve comprising: a fluid transfer valve assembly comprising a supply port and a control port; a moveable valve spool arranged to regulate flow of fluid from the supply port to the control port in response to a control signal; and a drive assembly configured to axially move the valve spool relative to the fluid transfer assembly in response to the control signal to regulate the fluid flow; wherein the drive assembly comprises a steerable member moveable by an amount determined by the control signal to cause corresponding movement of the valve spool; the drive assembly further comprising piezoelectric actuator means configured to move said steerable member in response to the control signal.

The fluid transfer valve assembly may also comprise a return port for pressure returning through the assembly.

The steerable member may comprise a flapper-type member or a jet-pipe with nozzle which can be steered in response to the control signal. The steerable member may be mounted within an armature and/or a flexible pipe.

In a jet-pipe system, a nozzle is preferably provided at an end of a jet pipe closest to the valve assembly and fluid from the nozzle is directed into the valve assembly via a receiver. The receiver is preferably configured such that when the nozzle is in a central position, fluid enters the valve assembly evenly via both sides of the receiver, e.g. by opposing lateral receiver channels. When the nozzle is steered to an off-centre position, more fluid flows to one side of the valve assembly than the other via the receiver; e.g. more flows through one lateral receiver channel than the other.

The piezoelectric actuator means preferably comprises a plurality of piezoelectric elements arranged to impart movement to the steerable member. In one embodiment, the piezoelectric actuator means comprises two piezoelectric elements mounted on opposite sides of the steerable member.

Preferred embodiments will now be described with reference to the drawings.

BRIEF DESCRIPTION OF THE DRAWINGS

FIG. 2A is a simplified view of a conventional servovalve.

FIG. 2B is a simplified view of a servovalve according to the disclosure.

DETAILED DESCRIPTION

Figure 1:
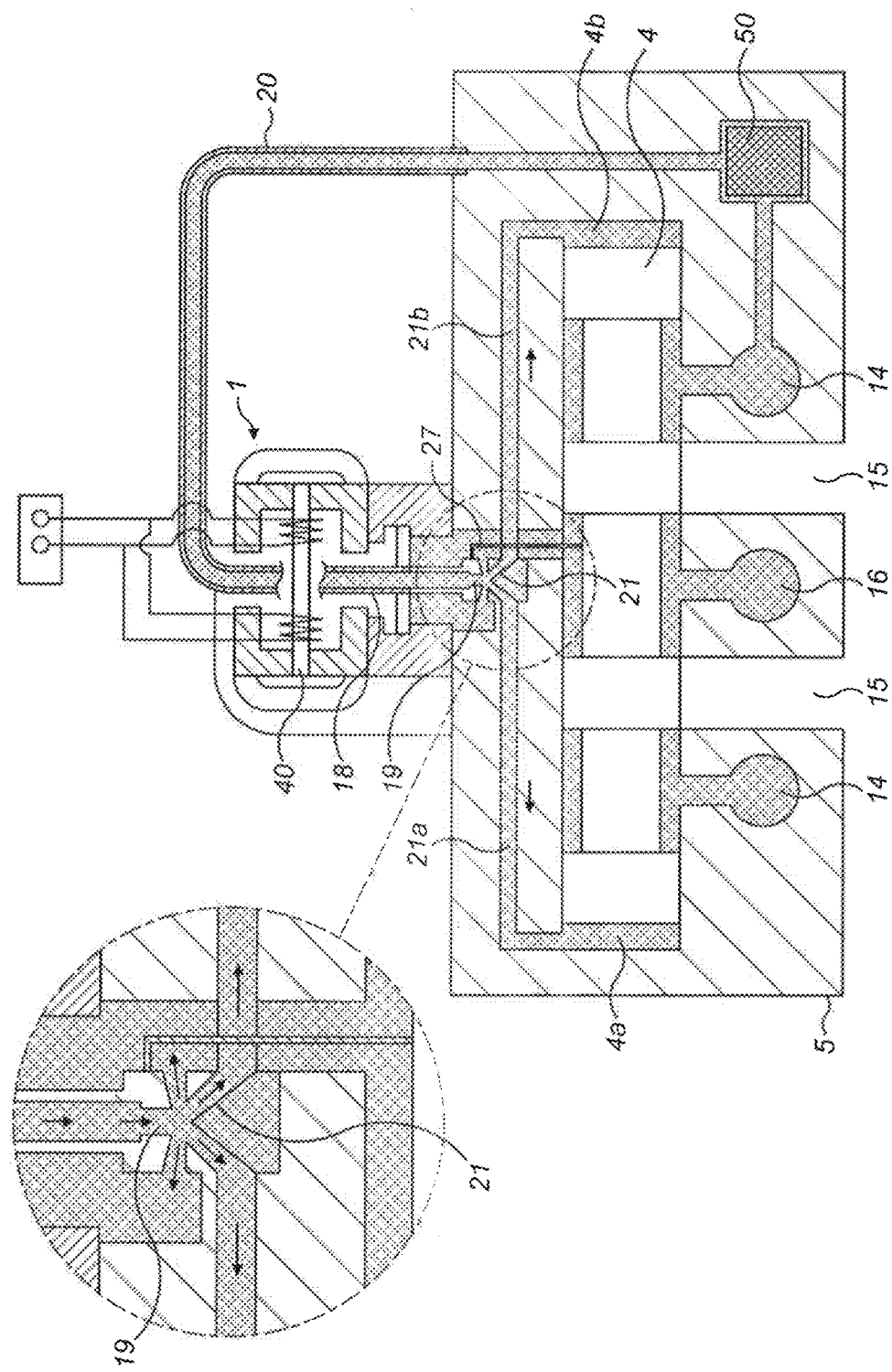
FIG. 1 is a schematic view of a conventional jet pipe servovalve.

A servovalve as described below can, for example, be used in an actuator control system. The servovalve is controlled by a torque motor to control a control flow of fluid that is output via e.g. a butterfly value to control the movement of an actuator.

With reference to FIGS. 1 and 2A FIG. 2A, a conventional jet pipe servovalve will first be described. The arrangement comprises a servovalve assembly have a torque motor 1 and a moveable spool 4 mounted in a supporting block 5. The spool 4 is part of a spool assembly having: supply ports 14, control ports 15, and a return port 16. Flow is possible between the ports via a passage through the spool 4. The torque motor 1 provides current that moves an armature 40 that causes a jet pipe 18 to turn at its end closest to the spool, which end terminates in a nozzle 19. Supply fluid is provided from the supply port, via a supply pipe 20, which may include a filter 50, to the top of the jet pipe i.e. the end opposite the end with the nozzle 19, and the supply fluid flows through the jet pipe and out of the nozzle 19. A receiver 21 is provided in the block below the nozzle. The receiver provides two channels 21a, 21b via which fluid from the nozzle 19 flows into the spool 4. When no current is applied by the motor to the jet pipe, the nozzle 19 is centered relative to the receiver 21 and supply fluid exiting the nozzle flows equally through both channels 21a, 21b and thus equally to both ends of the spool 4. The spool therefore remains centered—i.e. 'closed' so that no fluid flows through the control ports. When actuator control is desired, the motor provides a control current to the jet pipe via the armature 40 causing the nozzle to turn away from the centered position. The jet pipe and nozzle are turned due to an electromagnetic force created by electromagnets of the torque motor 1 acting on the armature which acts on the jet pipe. The supply fluid through the nozzle 19 then flows predominantly through one receiver channel 21a or 21b as compared to the other channel. More fluid flows, therefore, into the corresponding end of the spool 4 causing axial movement of the spool 4 with either blocks/occludes the passage between the supply port and the respective control port or opens the passage to allow flow between the two ports, depending on the axial position of the spool due to the position of the nozzle 19, thus modulating pressure on the control ports 15 and controlling the actuator (not shown).

In an example, the assembly is arranged to control an actuator based on the fluid flow from the control port 15 e.g. via a butterfly valve. The servovalve controls an actuator which, in turn, controls an air valve such as a butterfly valve.

Supply pressure is provided to the spool 4 via spool supply ports 14. The pressure at return port 16 is atmospheric pressure which will vary depending e.g. on the altitude of the aircraft in flight. Control ports 15 provide a controlled pressure, dependant on the nozzle position and resulting spool position, to be provided to an actuator. A supply pipe 20 is also connected to the supply port and routes supply fluid external to the spool and into the top end of the jet pipe 18. The supply fluid flows down the jet pipe 18 to the nozzle 19 and exits to the receiver 21 described above. The jet pipe 18 is preferably mounted in a flexural tube 26. While the nozzle 19 is centered as shown in FIG. 1, equal amounts of fluid go to the two ends 4a, 4b of the spool 4.

The spool 4 is in the form of a tubular member arranged in the block 5 to be moved axially by fluid from the jet pipe 18 via the nozzle 19 that is directed at the spool 4 via the receiver 21.

The feedback spring 27 serves to return the nozzle to the centered position.

In more detail, in the embodiment shown, to open the servovalve, control current is provided to coils of the motor (here a torque motor) creating electromagnetic torque opposing the sum of mechanical and magnetic torque already 'present' in the torque motor 1. The bigger the electromagnetic force from the coils, the more the jet pipe nozzle turns. The more it turns, the greater the linear or axial movement of the spool 4. A torque motor usually consists of coil windings, a ferromagnetic armature, permanent magnets and a mechanical spring (here two torsional bridge shafts). This arrangement provides movement of the nozzle 19 proportional to the input control current. Other types of motor could be envisaged.

According to the present disclosure, the torque motor is replaced by a piezoelectric actuator configured to cause movement of the jet pipe, in a jet pipe system, or of the flapper in a flapper-type system. This is shown, in an example, in FIG. 2B which can be compared with the conventional system of FIG. 2A.

Instead of the torque motor 1, a piezoelectric actuator is positioned around the jet pipe. Preferably, the piezoelectric actuator comprises two opposing piezoelectric elements 60a, 60b acting on the jet pipe from opposite sides. Operation of the elements will, via an elastic element 70a, 70b, cause the jet pipe and hence the nozzle to move responsive to the control signal to vary the flow to the ends 4a, 4b of the spool via the receiver channels 21a, 21b. The piezoelectric actuator can be located anywhere along the jet pipe and the location can be selected based, e.g. on the size of the piezoelectric elements.

It is also conceivable to replace the torque motor with a piezoelectric actuator in a flapper-type servovalve although this is not shown in the drawings. The position of the flapper element would be controlled by the piezoelectric force as with the jet pipe.

Operation of the spool and feedback is as in conventional systems.

The system of this disclosure has fewer component parts than conventional systems and the assembly is simpler, lighter and less expensive.

Although this disclosure has been described in terms of preferred examples, it should be understood that these examples are illustrative only and modifications and alterations are possible within the scope of the claims.

The invention claimed is:

1. A servovalve comprising:
   a fluid transfer valve assembly comprising a supply port and a control port within a housing;
   a moveable valve spool arranged to regulate flow of fluid from the supply port to the control port in response to a control signal; and
   a drive assembly configured to axially move the valve spool relative to the fluid transfer valve assembly in response to the control signal to regulate the fluid flow, wherein the drive assembly includes:
   a jet pipe moveable by an amount determined by the control signal to cause corresponding movement of the valve spool;
   a first piezoelectric actuator element;

a first elastic element extending radially outward from the jet pipe in a first direction and connected to the the first piezoelectric actuator element;

a second piezoelectric actuator element;

an elastic spring extending radially outward from the jet pipe in a direction opposite the first direction and connected to the second piezoelectric actuator element; and wherein contraction of the first piezoelectric actuator element causes the jet pipe to move the first direction and contraction of the second piezoelectric actuator element causes the jet pipe to move the second direction.

2. The servovalve of claim 1, wherein the fluid transfer valve assembly further comprises a return port for pressure returning through the fluid transfer valve assembly.

3. The servovalve of claim 1, wherein a nozzle is provided at an end of the jet pipe closest to the fluid transfer valve assembly and fluid from the nozzle is directed into the valve assembly via a receiver.

4. The servovalve of claim 3, wherein the receiver is configured such that when the nozzle is in a central position, fluid enters the valve assembly evenly via both sides of the receiver when the nozzle is steered to an off-centre position, more fluid flows to one side of the valve assembly than the other via the receiver.

5. The servovalve of claim 3, wherein the receiver comprises lateral receiver channels to provide flow to each side of the valve assembly.

6. The servovalve of claim 3, wherein the nozzle is provided on the jet pipe mounted within a flexible tube, wherein the tube imparts movement to the jet pipe to steer the nozzle in response to the control signal.

7. The servovalve of claim 1, further comprising:

the housing;

wherein the first and second piezoelectric actuators contact the housing.

* * * * *